(12) United States Patent
Hideo et al.

(10) Patent No.: US 10,896,933 B2
(45) Date of Patent: Jan. 19, 2021

(54) DISPLAY SUBSTRATE AND MANUFACTURING METHOD THEREOF

(71) Applicant: Wuhan China Star Optoelectronics Technology Co., Ltd., Hubei (CN)

(72) Inventors: Hirayama Hideo, Guangdong (CN); Hajime Nagai, Guangdong (CN)

(73) Assignees: WUHAN CHINA STAR OPTOELECTRONICS, Hubei (CN); TECHNOLOGY CO., LTD., Hubei (CN)

( * ) Notice: Subject to any disclaimer, the term of this patent is extended or adjusted under 35 U.S.C. 154(b) by 330 days.

(21) Appl. No.: 16/087,555

(22) PCT Filed: Jan. 24, 2018

(86) PCT No.: PCT/CN2018/073976
§ 371 (c)(1),
(2) Date: Sep. 21, 2018

(87) PCT Pub. No.: WO2019/075951
PCT Pub. Date: Apr. 25, 2019

(65) Prior Publication Data
US 2020/0295094 A1    Sep. 17, 2020

(30) Foreign Application Priority Data
Oct. 20, 2017  (CN) .......................... 2017 1 0998694

(51) Int. Cl.
*H01L 27/32* (2006.01)
*H01L 51/56* (2006.01)

(52) U.S. Cl.
CPC ...... *H01L 27/3211* (2013.01); *H01L 27/3276* (2013.01); *H01L 51/56* (2013.01); *H01L 2227/323* (2013.01)

(58) Field of Classification Search
CPC combination set(s) only.
See application file for complete search history.

(56) References Cited

U.S. PATENT DOCUMENTS

2012/0175647 A1* 7/2012 Yamashita .......... H01L 51/5228
                                                                  257/88
2013/0235094 A1* 9/2013 Cok ...................... H05B 45/20
                                                                  345/694
(Continued)

FOREIGN PATENT DOCUMENTS

CN       103348402 A    10/2013
CN       103489894 A    1/2014
(Continued)

*Primary Examiner* — Mamadou L Diallo
(74) *Attorney, Agent, or Firm* — Leong C. Lei

(57) ABSTRACT

Disclosed are a display panel and a manufacturing method thereof. A display area of the display panel has a display area includes a plurality of pixel units arranged in an array. Each of the pixel units includes a plurality of sub pixel units of different colors. The display device includes, in the display area, at least one driving circuit arranged between two adjacent rows of the pixel units. The driving circuit includes a plurality of sub driving circuits. Each of the sub pixels is connected through one signal conductor line to the sub driving circuits. The sub driving circuits transmit an image driving signal through the signal conductor lines to the sub pixel units to drive the sub pixel units to display an image.

10 Claims, 4 Drawing Sheets

(56) References Cited

U.S. PATENT DOCUMENTS

| | | | |
|---|---|---|---|
| 2014/0168289 A1* | 6/2014 | Shibata | G09G 3/3406 |
| | | | 345/690 |
| 2015/0349034 A1* | 12/2015 | Hack | H01L 27/3213 |
| | | | 257/40 |
| 2016/0275838 A1* | 9/2016 | Sun | H01L 27/3218 |
| 2016/0282642 A1* | 9/2016 | Li | G02F 1/134309 |
| 2017/0213522 A1* | 7/2017 | Xie | G09G 5/003 |
| 2019/0280055 A1* | 9/2019 | Hack | H01L 51/5209 |
| 2020/0234647 A1* | 7/2020 | Lin | G09G 3/3275 |

FOREIGN PATENT DOCUMENTS

| | | |
|---|---|---|
| CN | 103778886 A | 5/2014 |
| CN | 103943059 A | 7/2014 |
| CN | 104036726 A | 9/2014 |
| CN | 105489162 A | 4/2016 |
| CN | 106157877 A | 11/2016 |
| CN | 106601772 A | 4/2017 |
| KR | 20060038848 A | 5/2006 |
| WO | 2017074103 A1 | 5/2017 |

\* cited by examiner

DISPLAY SUBSTRATE AND MANUFACTURING METHOD THEREOF

CROSS REFERENCE TO RELATED APPLICATIONS

This application claims the priority of Chinese Patent Application No. 201710998694.6 filed on Oct. 20, 2017, titled "Display Substrate and Manufacturing Method Thereof", the disclosure of which is incorporated herein by reference in its entirety.

BACKGROUND OF THE INVENTION

1. Field of the Invention

The present invention relates to a micro organic light-emitting display device, and more particularly to a display substrate of a micro organic light-emitting diode and a manufacturing method thereof.

2. The Related Arts

With the continuous progress of organic light-emitting diode (OLED) technology, there are more and more applications of lighting and displaying that are based on semiconductor based LED. For example, LEDs that are based on semiconductors can be found in large-sized outdoor display devices and indoor and outdoor lighting. Micro organic light-emitting diode (Micro-LED) has been recently used in the field of consumer electronics, such as smart watches.

However, with the increasingly severe requirement of user concerning image displaying performance of display devices, namely the requirement for increased resolutions of display panels included in the display device, the number of data lines that are involved in a display panel for supply scan signals and image signals are abruptly increased, leading to increased difficulty for laying wires on the display panel.

SUMMARY OF THE INVENTION

To resolve the issue of laying wires for displaying becoming difficult, the present invention provides a display panel of which wires can be laid more easily.

A manufacturing method of such a display panel is also provided.

A display panel has a display area in which a plurality of pixel units are arranged in an array, wherein each of the pixel units comprises a plurality of sub pixel units of different colors. The display panel comprises, in the display area, at least one driving circuit arranged between two adjacent rows of the pixel units. The driving circuit comprises a plurality of sub driving circuits. Each of the sub pixels is connected, via one signal conductor line, to the sub driving circuits. The sub driving circuits transmit an image driving signal through the signal conductor lines to the sub pixel units to drive the sub pixel units to display an image.

A manufacturing method of a display panel comprises the following steps:

providing a base plate;

forming a driving circuit on one side of the base plate;

forming a first insulation layer on the driving circuit such that the first insulation layer covers the driving circuit;

patterning the first insulation layer to form through holes, such that parts of the driving circuit are exposed through the through holes;

forming signal conductor lines on a surface of the first insulation layer such that the signal conductor lines are electrically connected, via the through holes, to the driving circuit; and arranging pixel units on a surface of the signal conductor lines, such that the pixel units are electrically connected with the signal conductor lines;

wherein each of the pixel units comprises a plurality of sub pixel units of different colors, the driving circuit comprising a plurality of sub driving circuits, each of the sub pixels being connected through one of the signal conductor lines with the sub driving circuits, the sub driving circuits transmitting an image driving signal through the signal conductor lines to the sub pixel units for driving the sub pixel units to display an image.

Opposite to the prior art, since the pixel units of the display panel that functions to display an image is electrically connected, through one single type of signal conductor lines, to the driving circuit for achieving receiving of a switch signal and an image driving signal to proceed with image displaying, difficulty of laying wires of the pixel units can be greatly reduced and an additional space may be available for arrangement of the pixel units, such that the resolution of the display panel can be increased.

BRIEF DESCRIPTION OF THE DRAWINGS

To more clearly explain the technical solution of the present invention, a brief description of the drawings that are necessary for embodiments of the present invention is given below. It is obvious that the drawings that will be described below show only some embodiments of the present invention. For those having ordinary skills of the art, other drawings may be available from these attached drawings without the expense of creative effort and endeavor.

DETAILED DESCRIPTION OF THE PREFERRED EMBODIMENTS

A clear and complete description will be given below to technical solutions provided by embodiments of the present invention with reference to the attached drawings of the embodiments of the present invention. However, the embodiments described are only some, but not all, of the embodiments of the present invention. Other embodiments that are available to those having ordinary skills of the art based on the embodiment of the present invention, without the expense of creative effort and endeavor, are considered belonging to the scope of protection of the present invention.

Figure 1:
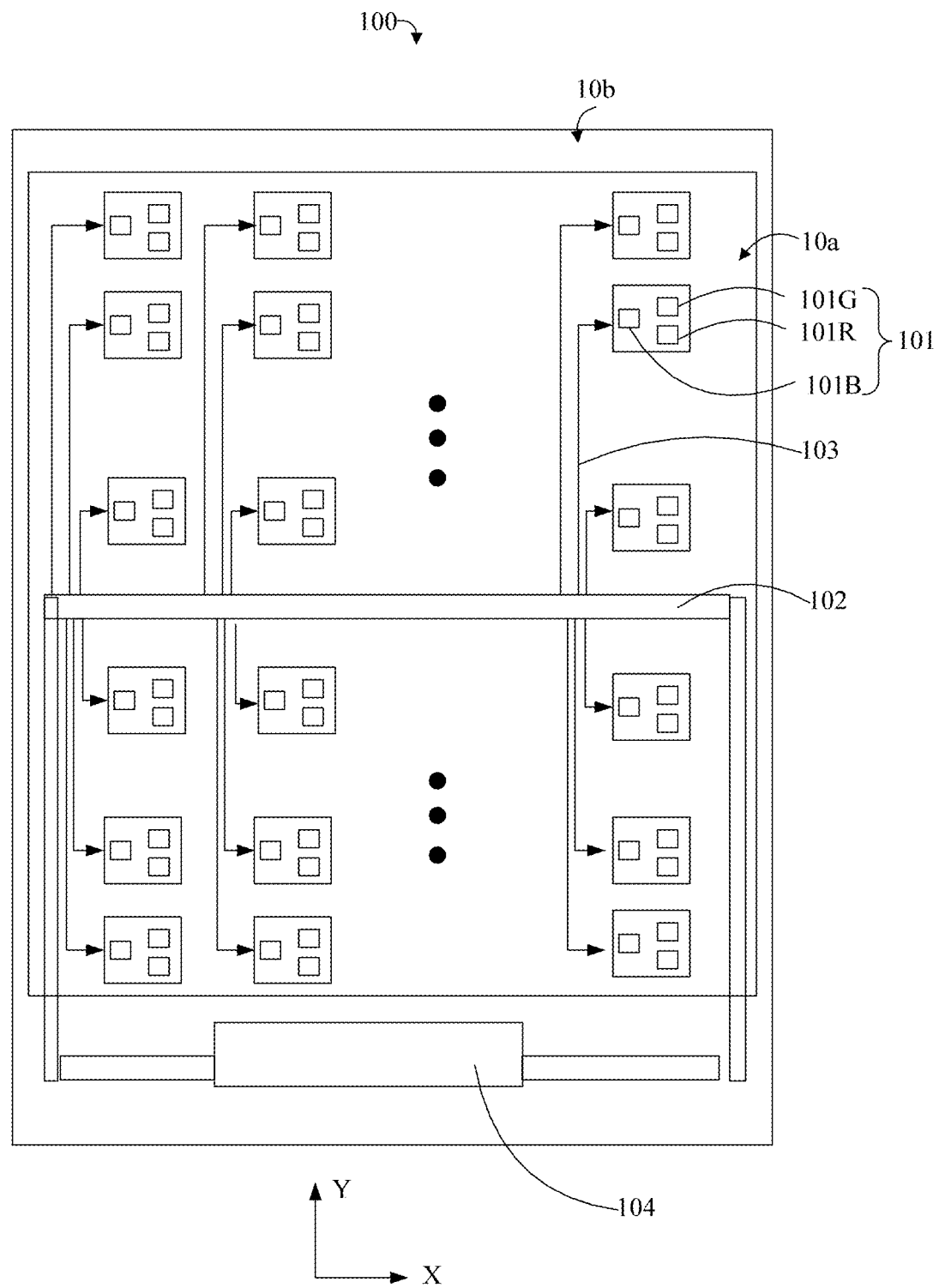
FIG. 1 is a schematic view illustrating a planar structure of a display panel according to an embodiment of the present invention.

Referring to FIG. 1, a schematic view illustrating a planar structure of a display panel 100 according to an embodiment of the present invention is shown.

As shown in FIG. 1, the display panel 100 has a display area 10a and a non-display area 10b, wherein the display area 10a comprises a plurality of pixel units 101 arranged as an array in a first direction X and a second direction Y that are perpendicular to each other.

Each of the pixel units 101 comprises sub pixels 101R, 101G, 101B of three colors, namely comprising sub pixels 101R, 101G, 101B of the three colors of red, green, and blue (RGB).

Also, in a middle portion of the display area 10a, a driving circuit 102 is arranged between two rows of the pixel units that are arranged to extend in the first direction X.

The driving circuit 102 is electrically connected, via a plurality of signal conductor lines 103, to the plurality of pixel units 101 and, specifically, the three color sub pixels 101R, 101G, 101B of each of the pixel units 102 are connected through the plurality of signal lines 103 to the driving circuit 102.

A control circuit 104 is arranged in the non-display area 10b and is electrically connected to the driving circuit 102 to supply a switch signal and an image signal to the driving circuit 102.

In the instant embodiment, the sub pixels 101R, 101G, 101B included in the pixel units 101 are all micro organic light-emitting diode (Micro LED).

Figure 2:
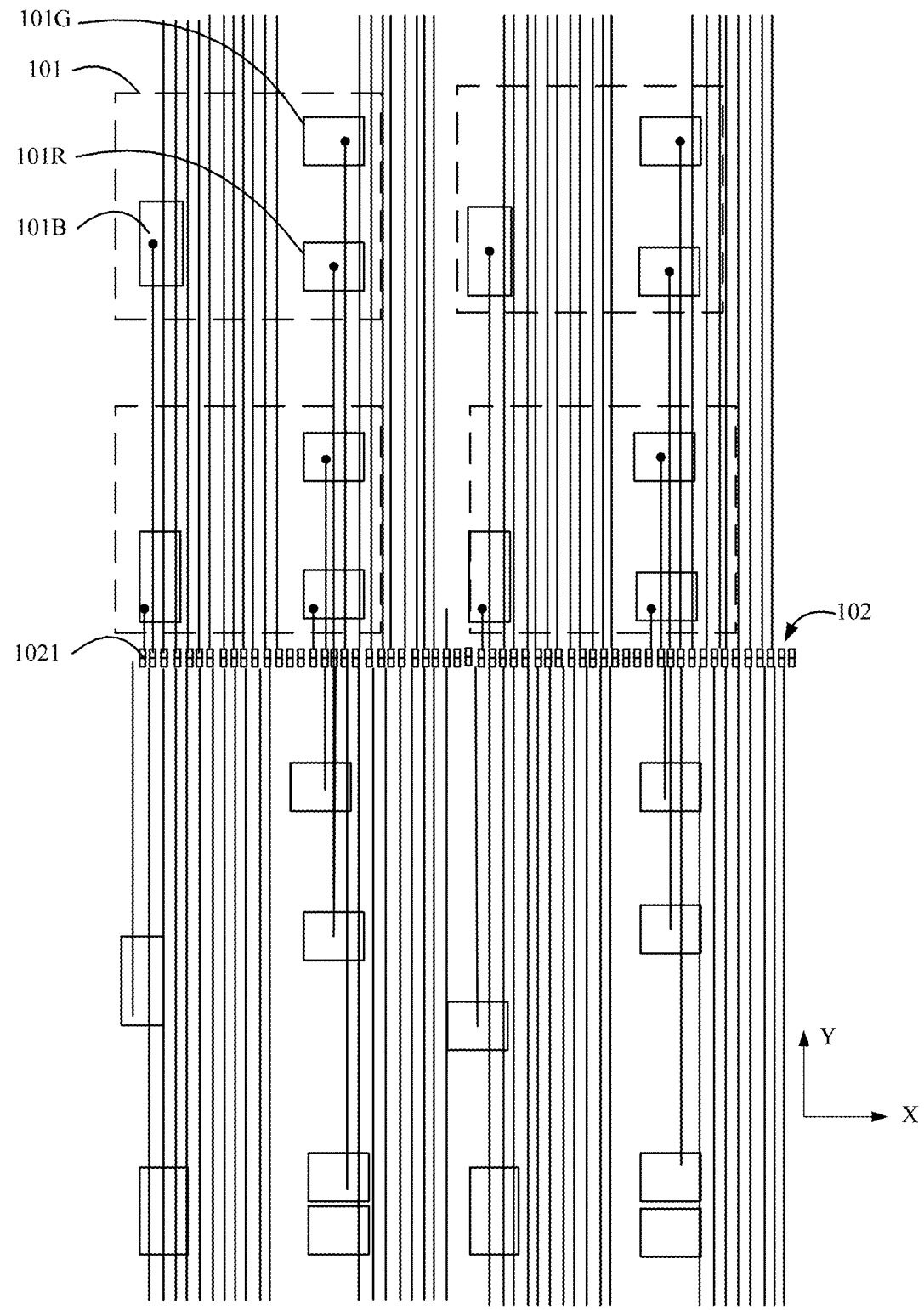
FIG. 2 is a schematic view illustrating, in an enlarged form, a structure of a portion of a driving circuit and pixel units shown in FIG. 1.

Specifically, referring to FIG. 2, a schematic view illustrating, in an enlarged form, a structure of a portion of the driving circuit and the pixel units shown in FIG. 1 is provided.

The driving circuit 102 comprises a plurality of sub driving circuits 1021, the plurality of sub driving circuits 1021 are arranged, is sequence, in the first direction X.

Each of the sub driving circuits 1021 is connected, through one of the signal lines 103 extending in the second direction Y, to one of the sub pixels 101R, the sub pixels 101G, or the sub pixels 101B.

The sub driving circuits 1021 are set by the switch signal supplied from the control circuit 104 in a conducting-on state or a cutting-off state. When the sub driving circuits 1021 are conducted on, an image driving signal transmitted from the sub driving circuits to the sub pixels 101R, the sub pixels 101G, or the sub pixels 101B corresponding thereto.

In the instant embodiment, the sub driving circuits 1021 that are operable to drive the sub pixels 101R, 101G, 101B each comprise a driving arrangement comprising two thin-film transistors and one capacitor. Of course, in an alternative form, the sub driving circuits 1021 may adopt an arrangement involving three thin-film transistors and one capacitor, but not limited thereto.

Figure 3:
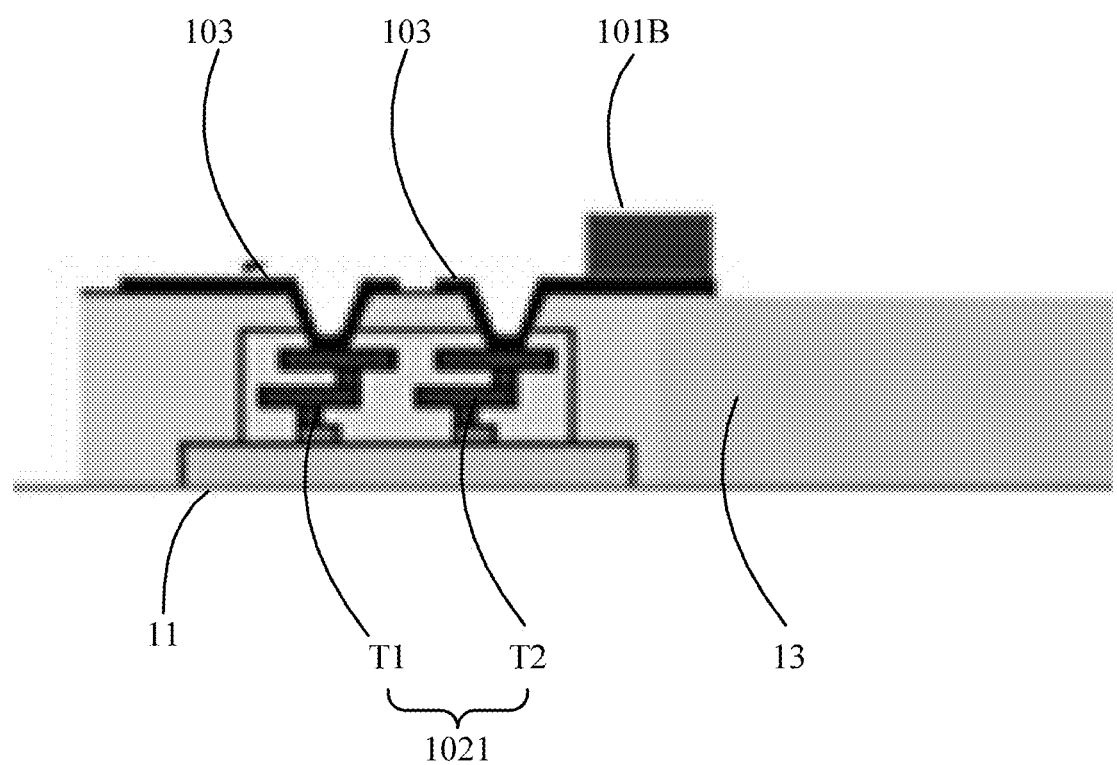
FIG. 3 is a schematic view illustrating a sideways structure of a sub driving circuit of FIG. 2.

Referring to FIG. 3, a schematic view illustrating a sideways structure of one sub driving circuit of FIG. 2 is provided.

As shown in FIG. 3, the display panel 100 comprises a base 11, a sub driving circuit 1021, a first insulation layer 13, signal conductor lines 103, and a sub pixel 101B of a pixel unit 101, which are stacked and arranged, in sequence, on a surface of the base 11 in a direction that is perpendicular to a plane defined by the first direction X and the second direction Y, meaning the sub driving circuit 1021, the first insulation layer 13, the signal conductor lines 103, and the sub pixels 101B of the pixel unit 101 are stacked and arranged, in sequence, in a thickness direction of the base 11. The first insulation layer 13 partly covers the driving circuit, and the signal conductor lines 103 extend, in the second direction Y, via through holes H defined in the first insulation layer 13, to electrically connect with the sub driving circuit 1021. The sub pixels 101B of the pixel unit 101 is arranged on a surface of the signal conductor lines 103 and is electrically connected with the signal conductor lines 103. In the instant embodiment, the blue sub pixel 101b of the pixel unit 101 is taken as an example; however, it is appreciated that other sub pixels of the pixel unit 101 may have a similar connection structure, such as a red sub pixel 101G or a green sub pixels 101G that is arranged to stack on the sub driving circuit 1021.

The sub driving circuit 1021 comprises a first thin-film transistor T1 and a second thin-film transistor T2, wherein the first thin-film transistor T1 is operable as a switch transistor, which is in electrical connection with the control circuit 104, and the second thin-film transistor T2 is operable as a driver transistor, which is electrically connected with the sub pixels 101B of the pixel unit 101. It is noted that the capacitor of the sub driving circuit 1021 is not shown in FIG. 3.

The first insulation layer 13 can be made of a material comprising silicon nitride (SiNx) and/or silicon oxide (SiOx) and the first insulation layer 13 also serves as a planarization layer for easing subsequent arrangement of the signal conductor lines 103 and the pixel unit 101. The first insulation layer 13 may be formed with through holes H by using a combination of a mask and photoresist. The through holes H respectively expose electrical connection parts of the first thin-film transistor T1 and the second thin-film transistor T2 to ease electrical connection of the signal conductor lines 103 provided on the insulation layer to the first thin-film transistor T1 and the second thin-film transistor T2.

Opposite to the prior art, since the pixel units 101 of the display panel 100 that functions to display an image is electrically connected, through one single type of signal conductor lines 103, to the driving circuit 102 for achieving receiving of a switch signal and an image driving signal to proceed with image displaying, difficulty of laying wires of the pixel units 101 can be greatly reduced and an additional space may be available for arrangement of the pixel units 101, such that the resolution of the display panel 100 can be increased and the cost of the display panel 100 can also be reduced.

Figure 4:
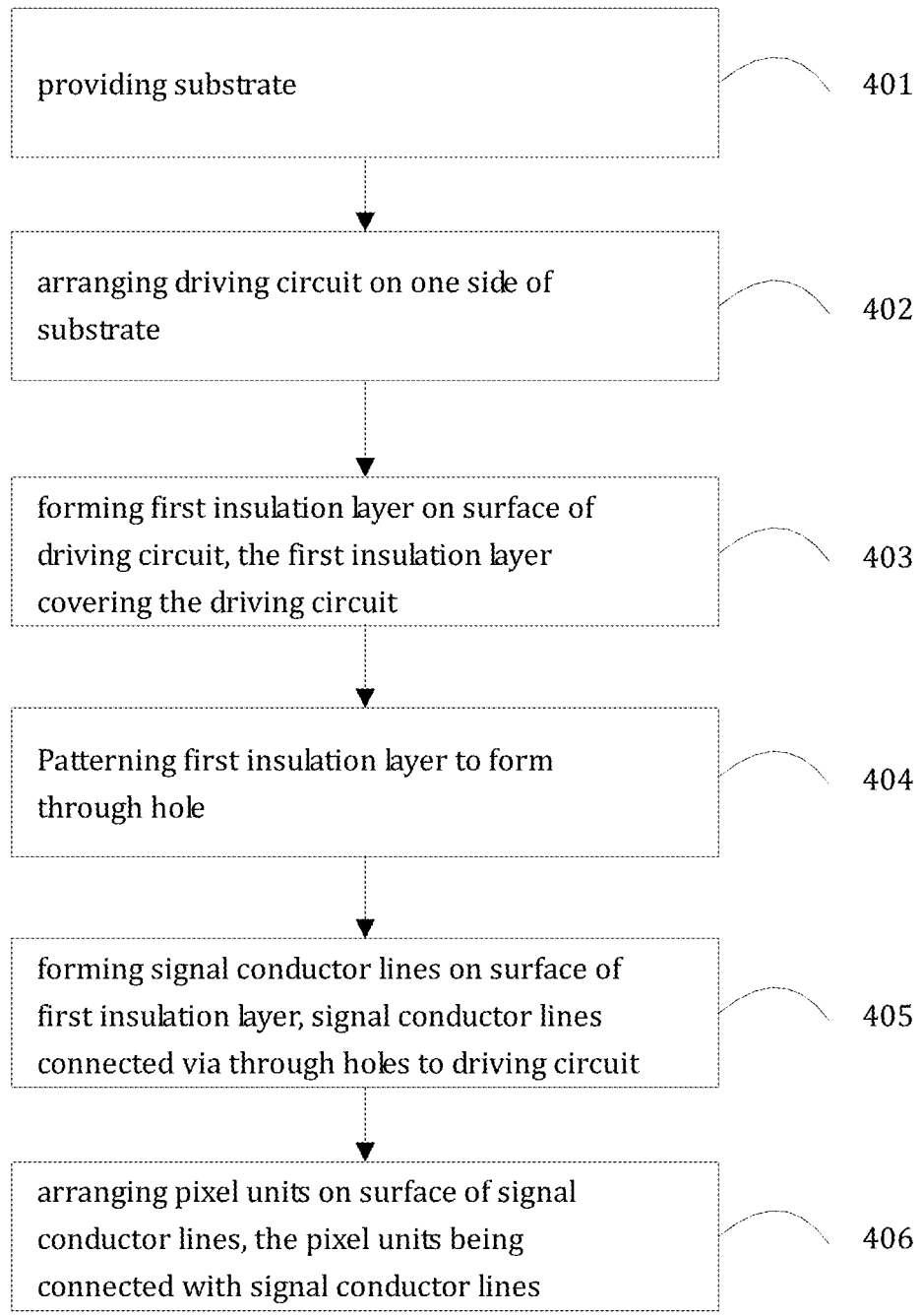
FIG. 4 is a flow chart illustrating a manufacturing method of the display panel shown in FIGS. 1-3.

Referring to FIG. 4, a flow chart illustrating a manufacturing method of the display panel shown in FIGS. 1-3 is provided.

As shown in FIG. 4, the manufacturing method of a display panel comprises the following steps:

Step 401, providing a base plate 11 and subjecting the base plate 11 to pre-treatment, such as cleaning and forming a polyimide (PI) layer. The base plate 11 can be made of a material of glass or a plastic substance.

Step 402, arranging a driving circuit 102 on a surface of one side of the base plate 11, namely forming, in parallel, a plurality of sub driving circuits 1021 arranged on the base plate 11 in a first direction.

The sub driving circuits 1021 each comprise a first thin-film transistor T1 and a second thin-film transistor T2. The first thin-film transistor T1 and the second thin-film transistor T2 can be bottom-gate N-type thin-film transistors, or can alternatively be top-gate P-type thin-film transistors. The first thin-film transistor T1 is operable as a switch transistor, and the second thin-film transistor T2 is operable as a driver transistor.

Further, treatment, such as curing and cleaning, may be carried out for the base plate 11 on which the driving circuit 102 is provided.

Step 403, arranging a first insulation layer 13 on the driving circuit 102 such that the first insulation layer 13 covers the driving circuit 102. The first insulation layer 13 can be made of a material comprising silicon nitride (SiNx) and/or silicon oxide (SiOx) through a chemical vapor deposition (CVD) process. In addition, the first insulation layer 13 also functions as planarization layer for easing subsequent formation of other components.

Step 404, patterning the first insulation layer 13 to form through holes H. The through holes H correspond, in position, to drain electrodes of the first thin-film transistors T1 and the second thin-film transistors T2 of the sub driving circuits 1021 of the driving circuit 102.

Step 405, arranging signal conductor lines 103 on a surface of the first insulation layer 13 such that the signal conductor lines 103 are electrically connected, via the through holes H, to the driving circuit 102. Specifically, the signal conductor lines 103 are electrically connected, via the through holes H, to the drain electrodes of the first thin-film transistors T1 and the second thin-film transistors T2, respectively. Of course, source electrodes (not shown) and gate electrodes (not shown) of the first thin-film transistors T1 and the second thin-film transistors T2 are electrically connected to the driving circuit 102 that supply an image driving signal.

Step 406, arranging pixel units 101 on a surface of the signal conductor lines 103 such that the pixel units 101 are electrically connected to the signal conductor lines to receive the image driving signal.

It is noted that the driving circuit is arranged in a middle portion of a display area 10a and is located between two adjacent rows of the pixel units.

The embodiments described above are not construed as constraining to the scope of protection of the technical solutions so provided. Modifications, equivalent substitutes, and improvements within the spirit and principle of the above-described embodiment are considered belonging the scope of protection of those technical solutions.

What is claimed is:

1. A display panel having a display area in which a plurality of pixel units are arranged in an array, each of the pixel units comprising a plurality of sub pixel units of different colors, wherein the display panel comprises, in the display area, at least one driving circuit arranged between two adjacent rows of the pixel units, the driving circuit comprising a plurality of sub driving circuits, each of the sub pixels being connected, via one signal conductor line, to the sub driving circuits, the sub driving circuits transmitting an image driving signal through the signal conductor lines to the sub pixel units to drive the sub pixel units to display an image, wherein the plurality of sub driving circuits of the at least one driving circuit are arranged in sequence to form a row, the row of the sub driving circuits being located between and spaced from the two adjacent rows of the pixel units between which the at least one driving circuit is arranged.

2. The display panel according to claim 1, wherein the plurality of sub driving circuits are arranged, in parallel, in a first direction and the signal conductor lines are arranged to extend in a second direction and electrically connecting the sub driving circuits and corresponding ones of the sub pixel units, the first direction being perpendicular to the second direction.

3. The display panel according to claim 2, wherein the display panel has a non-display area in which a control circuit is arranged, the control circuit being electrically connected with the plurality of sub driving circuits of the driving circuit, the control circuit supplying simultaneously a switch signal and the image driving signal to the driving circuit, the switch signal controlling timing sequence of conducting on the plurality of sub driving circuits, and when the sub driving circuits are conducted on, the image driving signal is transmitted from the sub driving circuits to the corresponding ones of the pixel units.

4. The display panel according to claim 1, wherein the display panel comprises a base and the driving circuit, a first insulation layer, the signal conductor lines, and the pixel units that are arranged to stack, in sequence, on a surface of the base, the first insulation layer covering partly the driving circuit, the signal conductor lines extending, in the second direction, through the first insulation layer to electrically connect with the driving circuit, the pixel units being arranged on a surface of the signal conductor lines and electrically connected with the signal conductor lines.

5. The display panel according to claim 4, wherein the sub driving circuits are all arranged on the same layer on the surface of the base and the sub driving circuits each comprise at least two thin-film transistors.

6. The display panel according to claim 1, wherein the sub pixel units are each a micro organic light-emitting diode.

7. A manufacturing method of a display panel, comprising:
providing a base plate;
forming a driving circuit on one side of the base plate;
forming a first insulation layer on the driving circuit such that the first insulation layer covers the driving circuit;
patterning the first insulation layer to form through holes, such that parts of the driving circuit are exposed through the through holes;
forming signal conductor lines on a surface of the first insulation layer such that the signal conductor lines are electrically connected, via the through holes, to the driving circuit; and
arranging pixel units on a surface of the signal conductor lines, such that the pixel units are electrically connected with the signal conductor lines;
wherein each of the pixel units comprises a plurality of sub pixel units of different colors, the driving circuit being arranged between two adjacent rows of the pixel units, the driving circuit comprising a plurality of sub driving circuits, each of the sub pixels being connected through one of the signal conductor lines with the sub driving circuits, the sub driving circuits transmitting an image driving signal through the signal conductor lines to the sub pixel units for driving the sub pixel units to display an image, and
wherein the plurality of sub driving circuits of the driving circuit are arranged in sequence to form a row, the row of the sub driving circuits being located between and spaced from the two adjacent rows of the pixel units between which the at least one driving circuit is arranged.

8. The manufacturing method of a display panel according to claim 7, wherein the plurality of sub driving circuits are arranged, in parallel, in a first direction and the signal conductor lines are arranged to extend in a second direction and electrically connecting the sub driving circuits and corresponding ones of the sub pixel units, the first direction being perpendicular to the second direction.

9. The manufacturing method of a display panel according to claim 8, wherein the sub driving circuits are all arranged on the same layer on the surface of the base and the sub driving circuits each comprise at least two thin-film transistors.

10. The manufacturing method of a display panel according to claim 9, wherein the sub pixel units are each a micro organic light-emitting diode.

* * * * *